(12) United States Patent
Kudo et al.

(10) Patent No.: US 7,017,069 B2
(45) Date of Patent: Mar. 21, 2006

(54) PWM CONTROL CIRCUIT, MICROCOMPUTER AND ELECTRONIC EQUIPMENT

(75) Inventors: Makoto Kudo, Fujimi-machi (JP); Katsuya Iida, Chino (JP)

(73) Assignee: Seiko Epson Corporation, Tokyo (JP)

( * ) Notice: Subject to any disclaimer, the term of this patent is extended or adjusted under 35 U.S.C. 154(b) by 163 days.

(21) Appl. No.: 10/681,302

(22) Filed: Oct. 9, 2003

(65) Prior Publication Data

US 2004/0070436 A1    Apr. 15, 2004

Related U.S. Application Data

(63) Continuation of application No. 09/525,261, filed on Mar. 14, 2000, now Pat. No. 6,658,583.

(30) Foreign Application Priority Data

Mar. 16, 1999    (JP)    ................................. 11-069709

(51) Int. Cl.
    *G06F 1/04*    (2006.01)
(52) U.S. Cl. ...................... 713/500; 713/503; 332/106; 332/109
(58) Field of Classification Search ................ 713/401, 713/500, 501, 502, 503, 600
    See application file for complete search history.

(56) References Cited

U.S. PATENT DOCUMENTS

| | | |
|---|---|---|
| 4,951,159 A | 8/1990 | Van Beek |
| RE34,660 E | 7/1994 | Belcher |
| 5,594,631 A * | 1/1997 | Katoozi et al. ............... 363/41 |
| 6,201,414 B1 | 3/2001 | Yazdy |
| 6,236,427 B1 | 5/2001 | Roylance et al. |
| 6,299,272 B1 | 10/2001 | Baker et al. |

FOREIGN PATENT DOCUMENTS

JP    03-131125    6/1991

OTHER PUBLICATIONS

Ronald J. Tocci, "Digital Systems Principles and Applications", 1980, Prentice Hall, p. 330.*

* cited by examiner

*Primary Examiner*—Lynne H. Browne
*Assistant Examiner*—Paul Yanchus, III
(74) *Attorney, Agent, or Firm*—Oliff & Berridge, PLC

(57) ABSTRACT

A PWM control circuit, microcomputer and electronic equipment which can generate high-resolution PWM signals through a small-sized scale of circuit. The PWM control circuit includes a PWM period value setting register, a counter, an edge-point value setting register, a PWM output circuit for varying the level of the PWM signal at a first edge-point, and a delay value setting register provided on low order side of the edge-point value setting register, for specifying a delay time of the first edge-point. The PWM output circuit delays the first edge-point by a period smaller than one clock period of CLK, in accordance with the value in the delay value setting register. This can improve the resolution of the PWM signal. One-bit or two-bit value is stored in the delay value setting register. Based on the stored value, the first edge-point can be delayed by ½, ¼, ⅔ or ¾ clock period.

6 Claims, 10 Drawing Sheets

PWM CONTROL CIRCUIT, MICROCOMPUTER AND ELECTRONIC EQUIPMENT

This is a Continuation of application Ser. No. 09/525,261 filed Mar. 14, 2000 now U.S. Pat. No. 6,658,583. The entire disclosure of the prior application is hereby incorporated by reference herein in its entirety.

BACKGROUND OF THE INVENTION

1. Field of the Invention

The present invention relates to a PWM control circuit, microcomputer and electronic equipment.

2. Description of the Related Art

There is known a PWM control circuit for generating such PWM (pulse-width modulation) signals as shown in FIG. 1A.

A conventional PWM control circuit as shown in FIG. 1B comprises a PWM period value setting register 900, a counter 902, an edge-point value setting register 904, comparators 906, 908 and an RS flip-flop 909, for example.

The PWM period value setting register 900 is one that stores a period value for specifying the period TP of a PWM signal shown in FIG. 1C. The counter (increment counter) 902 increments a count value based on an operation clock CLK. The edge-point register 904 stores an edge-point setting for specifying a first edge-point (or rising edge) 910 of FIG. 1C at which the level of the PWM signal may change from L-level to H-level, for example.

The comparator 906 compares the edge-point value from the edge-point value setting register 904 with the count value from the counter 902. If they are identical with each other, the comparator 906 generates a H-level signal to be outputted toward the terminal S (set terminal) of the RS flip-flop 909. Thus, the PWM signal will vary from L-level to H-level as shown by the first edge-point (or rising edge) 910 in FIG. 1C.

The comparator 908 compares the period value from the PWM period value setting register 900 with the count value from the counter 902. If they are identical with each other, the comparator 908 generates a H-level signal to be outputted toward the terminal R (reset terminal) of the RS flip-flop 909. Thus, the PWM signal will vary from H-level to L-level as shown by the second edge-point (or falling edge) 912 in FIG. 1C.

However, it was found that such a PWM control circuit of the prior art raised the following problems when it was included in a microcomputer or ASIC.

For example, there is now assumed a case where the PWM signal outputted from the PWM control circuit is converted into an analog sound signal that is in turn utilized to generate a game sound in a game apparatus or a guide voice in a car navigation system. In such a case, the frequency FP of the PWM signal must be set at 80 KHz or higher to prevent inclusion of any returned noise for generating a high-quality sound. Namely, the period TP of the PWM signal shown in FIG. 1C must be set at 1/FP=12.5 μs or lower.

On the other hand, the frequency FC of the operation clock CLK for actuating the counter 902 of FIG. 1B will be restricted in its upper limit due to the performance of the microcomputer or ASIC in which the PWM control circuit is included. For example, a conventional microcomputer designed to aim at reduction of the cost may have its operation clock CLK ranging between 20 MHz and 40 MHz.

For example, if FC is equal to 20 MHz, the resolution (conversion accuracy) of D/A conversion by PWM signal will be equal to about $2^8$ from the calculation of FC/FP= $(20 \times 10^6)/(80 \times 10^3)=250$. This corresponds to the resolution of an 8-bit D/A converter. With FC=40 MHz, the resolution of D/A conversion by PWM signal will be equal to about $2^9$ from the calculation of FC/FP=$(40 \times 10^6)/(80 \times 10^3)=500$. This corresponds to the resolution of a 9-bit D/A converter. In a microcomputer in which the frequency FC of the operation clock CLK ranges between 20 MHz and 40 MHz, the PWM signal having its resolution of 8–9 bits can only be generated.

In the sound output of a modern electronic equipment such as game apparatus or car navigation system, however, the resolution equal to or more than 10 bits is frequently required. Therefore, the microcomputer in which the frequency FC of the operation clock CLK ranges between 20 MHz and 40 MHz as described cannot meet such a requirement. The microcomputer to be incorporated into such electronic equipment had no other choice but to include an analog D/A converter such as resistance ladder type or serial conversion type. However, such an analog D/A converter has its increased circuit scale and is difficult to design its circuit for realizing the high performance. This leads to various problems in increase of the coat, prolongation of the period required by designing and so on.

SUMMARY OF THE INVENTION

In view of the above-described problems, it is an objective of the present invention to provide a PWM control circuit, microcomputer and electronic equipment which can generate a high-resolution PWM signal through a reduced circuit scale.

To this end, there is provided a PWM (pulse width modulation) control circuit for generating a PWM signal, according to a first aspect of the present invention. This PWM control circuit comprises: a counter for incrementing or decrementing a count value in accordance with a given operation clock; an edge-point value setting register for storing an edge-point value which specifies a first edge-point at which the level of the PWM signal varies; a PWM output circuit for varying the level of the PWM signal at the first edge-point specified by the edge-point value, based on the count value from the counter and the edge-point value from the edge-point value setting register; and a delay value setting register provided on low order side of the edge-point value setting register, for storing a delay value of at least one bit which specifies a delay time of the first edge-point, wherein the PWM output circuit delays the first edge-point by a period which is smaller than one-clock period of the operation clock, in accordance with the delay value stored in the delay value setting register.

According to this aspect of the present invention, the first edge-point is specified by the edge-point value from the edge-point value setting register to generate the PWM signal having its signal level varied at the first edge-point. Furthermore, the first edge-point is delayed by a period smaller than one clock period of the operation clock, according to the delay value from the delay value setting register. Thus, the same resolution as that obtained by increasing the frequency of the operation clock can be obtained without increase of the operation clock frequency. And yet, the resolution of a PWM signal can be improved merely by adding a small-scaled circuit to the conventional PWM control circuit. In other words, the high-resolution PWM signal can be implemented through a small-sized circuit scale.

The delay value setting register may store one-bit delay value, and the PWM output circuit may delay the first edge-point by one-half clock period of the operation clock, in accordance with the one-bit delay value stored in the delay value setting register. Thus, the resolution of the PWM signal can be improved by one bit merely by adding the one-bit delay value setting register, the circuit for delaying the first edge-point, or the like.

The PWM output circuit may comprise: a comparator for comparing the count value from the counter with the edge-point value from the edge-point value setting register to generate a first signal having a signal level which varies at the first edge-point specified by the edge-point value; a delay circuit for generating a second signal having a signal level which varies at a point delayed from the first edge-point by one-half clock period of the operation clock, based on the first signal and the operation clock; and a multiplexer for selecting the first signal when the one-bit delay value stored in the delay value setting register is at a first level, and for selecting the second signal when the one-bit delay value is at a second level. Thus, the resolution of the PWM signal can be improved by one bit merely by adding a small-scaled circuit. In addition, the PWM signal can be obtained with its increased accuracy since the delay of signal in the delay circuit is based on the operation clock.

The delay value setting register may store an M-bit delay value, and the PWM output circuit may delay the first edge-point by any one of substantially $1/2^M$ clock period, substantially $2/2^M$ clock period, ... and substantially $(2^M-1)/2^M$ clock period of the operation clock, in accordance with the M-bit delay value stored in the delay value setting register. Thus, the resolution of the PWM signal can be improved by M bits merely by adding the M-bit delay value setting register, the circuit for delaying the first edge-point, and so on.

The PWM output circuit may comprise: a comparator for comparing the count value from the counter with the edge-point value from the edge-point value setting register to generate a first signal having a signal level which varies at the first edge-point specified by the edge-point value; a delay circuit for generating a second signal having a signal level which varies at a point delayed from the first edge-point by substantially $1/2^M$ clock period of the operation clock, a third signal having a signal level which varies at a point delayed from the first edge-point by substantially $2/2^M$ clock period in the operation clock, ... and a $2^M$-th signal having a signal level which varies at a point delayed from the first edge-point by substantially $(2^M-1)/2^M$ clock period of the operation clock, based on the first signal, the operation clock and a given delay element; and a multiplexer for selecting any of the first through $2^M$-th signals in accordance with the M-bit delay value stored in the delay value setting register. Thus, the resolution of the PWM signal can be improved by M bits. In such a case, an error may be increased depending on the variation in the delay of the delay element. However, the present invention utilizes the PWM control to ensure the high-accuracy for one clock width. Thus, the accuracy in the level of one clock is very high. Furthermore, the error is only by the low-order M bits thereof. Therefore, the present invention can totally provide a further improved accuracy, compared with the other systems such as a resistance ladder type of D/A conversion having its accuracy depending on the resistance value.

According to a second aspect of the present invention, there is provided a microcomputer for performing information processing, comprising: a programmable timer including the above-described PWM control circuit; and a processor for executing instructions and for performing processing for storing the edge-point and delay values in the edge-point and delay value setting registers in the PWM control circuit. Thus, the PWM control circuit for generating a high-resolution PWM signal can be incorporated into the microcomputer merely by adding a small-scaled circuit to a programmable timer inherently possessed by the microcomputer.

According to a third aspect of the present invention, there is provided electronic equipment comprising: the above described microcomputer; a source of input data to be processed by the microcomputer; and an output device for outputting an analog signal by using the PWM signal generated by the PWM control circuit included in the microcomputer. Thus, the electronic equipment can more inexpensively be manufactured while improving the analog signals such as sound outputted from the electronic equipment and so on.

DETAILED DESCRIPTION OF PREFERRED EMBODIMENTS

Several preferred embodiments of the present invention will now be described in detail with reference to the accompanying drawings.

1. First Embodiment

Figure 2A:
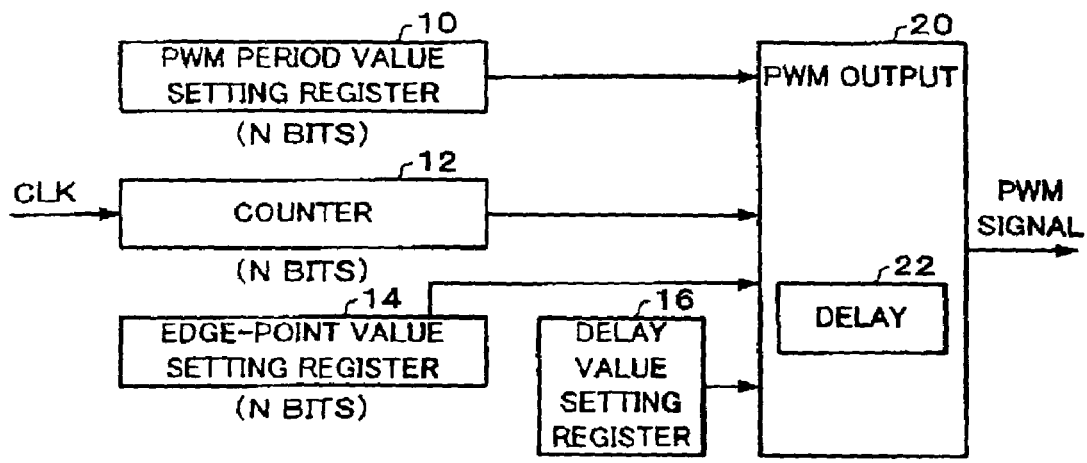
FIG. 2A is a block diagram of a PWM control circuit constructed according to the first embodiment of the present invention and FIG. 2B is a diagram of signal waveform illustrating the operation thereof.

FIG. 2A shows a block diagram of a PWM control circuit constructed according to the first embodiment of the present invention. The PWM control circuit comprises a PWM period value setting register 10, a counter 12, an edge-point value setting register 14, a delay value setting register 16 and a PWM output circuit 20. The PWM output circuit 20 includes a delay circuit 22.

Figure 2B:
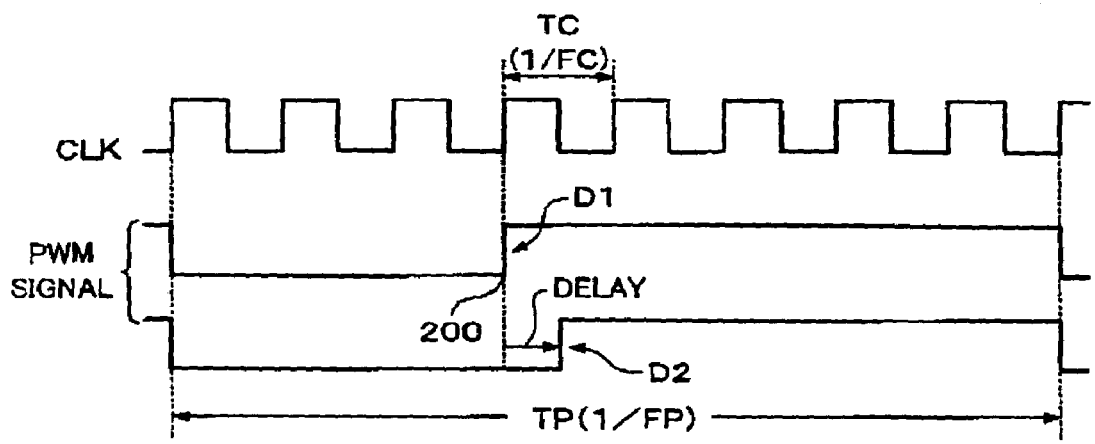

The PWM period value setting register 10 is in the form of an N-bit register which stores a period value for specifying the period TP of a PWM signal shown in FIG. 2B. The counter 12 is in the form of a counter which increments or decrements its count value according to an operation clock CLK. The edge-point value setting register 14 is in the form of a N-bit register which stores an edge-point value for specifying a first edge-point 200 of FIG. 2B whereat the level of the PWM signal may vary from L-level to H-level, for example.

The PWM period value setting register 10 or edge-point value setting register 14 may be any of various known registers using D flip-flop, logical circuit, semiconductor memory or the like. The counter 12 may also be either of known increment or decrement counter. The PWM period value setting register 10 may be of any component and replaced by a circuit for outputting a fixed period value (e.g. a group of N-bit switches) or the like.

The PWM output circuit 20 varies the level of the PWM signal at a first edge-point 200 of FIG. 2B which is specified by the edge-point value, according to the count value from the counter 12 and the edge-point value from the edge-point value setting register 14.

Figure 1A:
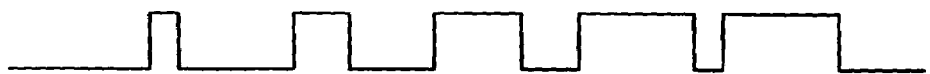
FIGS. 1A, B and C illustrate problems in a conventional PWM control circuit.
Figure 1B:
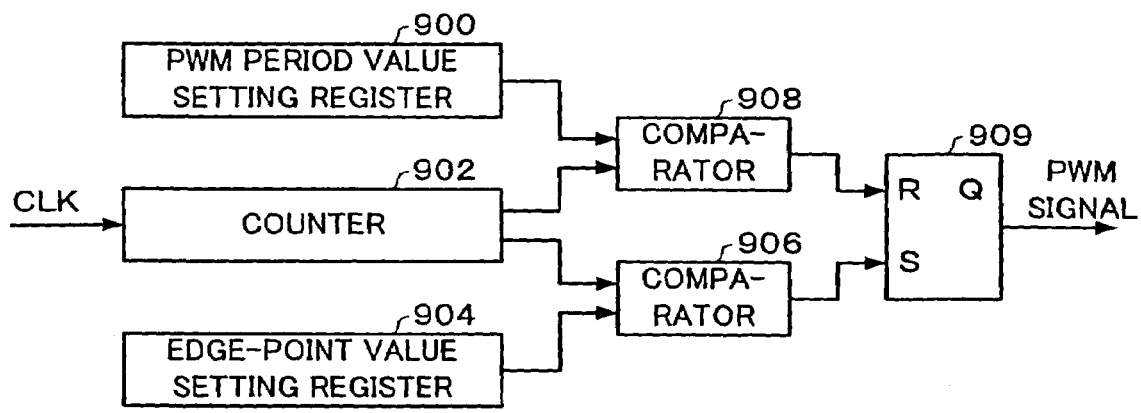

Unlike the prior art of FIG. 1B, this embodiment utilizes the delay value setting register 16 provided on low order side (downstream) of the edge-point value setting register 14, the delay value setting register 16 which stores one-bit or plural-bit delay value for specifying the delay time of the first edge-point 200. This embodiment is characterized by that the delay circuit 22 delays the first edge-point 200 of the PWM signal by a period smaller than one clock period TC of CLK as shown by D1 and D2 in FIG. 2B, according to the delay value stored in the delay value setting register 16.

A case where the delay value is one bit will be described. If the delay value or bit 0 is zero, the first edge-point 200 of the PWM signal will not be delayed as shown by D1 in FIG. 2B. On the other hand, if the delay value or bit 0 is one, the first edge-point 200 will be delayed by ½ clock period in the operation clock CLK as shown by D2, for example.

In such a manner, the resolution of the PWM signal (or the accuracy of D/A conversion utilizing the PWM signal) can be improved without use of very large scale of circuit.

In other words, the prior art of FIG. 1B could only realize 8-bit resolution for the frequency FC of the operation clock CLK equal to 20 MHz or 9-bit resolution for 40 MHz.

In contrary, this embodiment can realize over-9-bit resolution for the CLK frequency equal to 20 MHz and over-10-bit resolution for 40 MHz. For example, if the delay value of the delay value setting register 16 is one bit so as to delay the first edge-point 200 by ½ clock period of CLK, the CLK frequency of 20 MHz can attain 9-bit resolution while the CLK frequency of 40 MHz can realize 10-bit resolution. Therefore, a microcomputer having the PWM control circuit according to this embodiment can be incorporated into electronic equipment requiring 9-bit or 10-bit resolution.

In addition, this embodiment merely adds some circuits such as the delay value setting register 16, delay circuit 22 and soon to the prior art of FIG. 1B. Thus, the present invention can improve the resolution of the PWM signal while minimizing the scale of circuit.

In particular, when the PWM control circuit according to this embodiment is included in a microcomputer, the PWM control circuit of this embodiment can be implemented by adding the minimum number of circuits (or delay value setting register 16, delay circuit 22 and the like) to a programmable timer normally possessed by the microcomputer. The circuit scale of these delay value setting register 16 and delay circuit 22 can be substantially as small as be neglected, compared with the circuit scale of the microcomputer. Thus, the circuit scale and/or cost in the microcomputer will not substantially be increased even though the delay value setting register 16 and delay circuit 22 are added thereto. As a result, the present invention can meet the requirements in the electronic equipment requiring 9-bit or 10-bit resolution while reducing the circuit scale, manufacturing cost and time period required by the designing, compared with the prior art microcomputer including the D/A converter formed by large-scale and complicated circuits.

2. Second Embodiment

Figure 3:
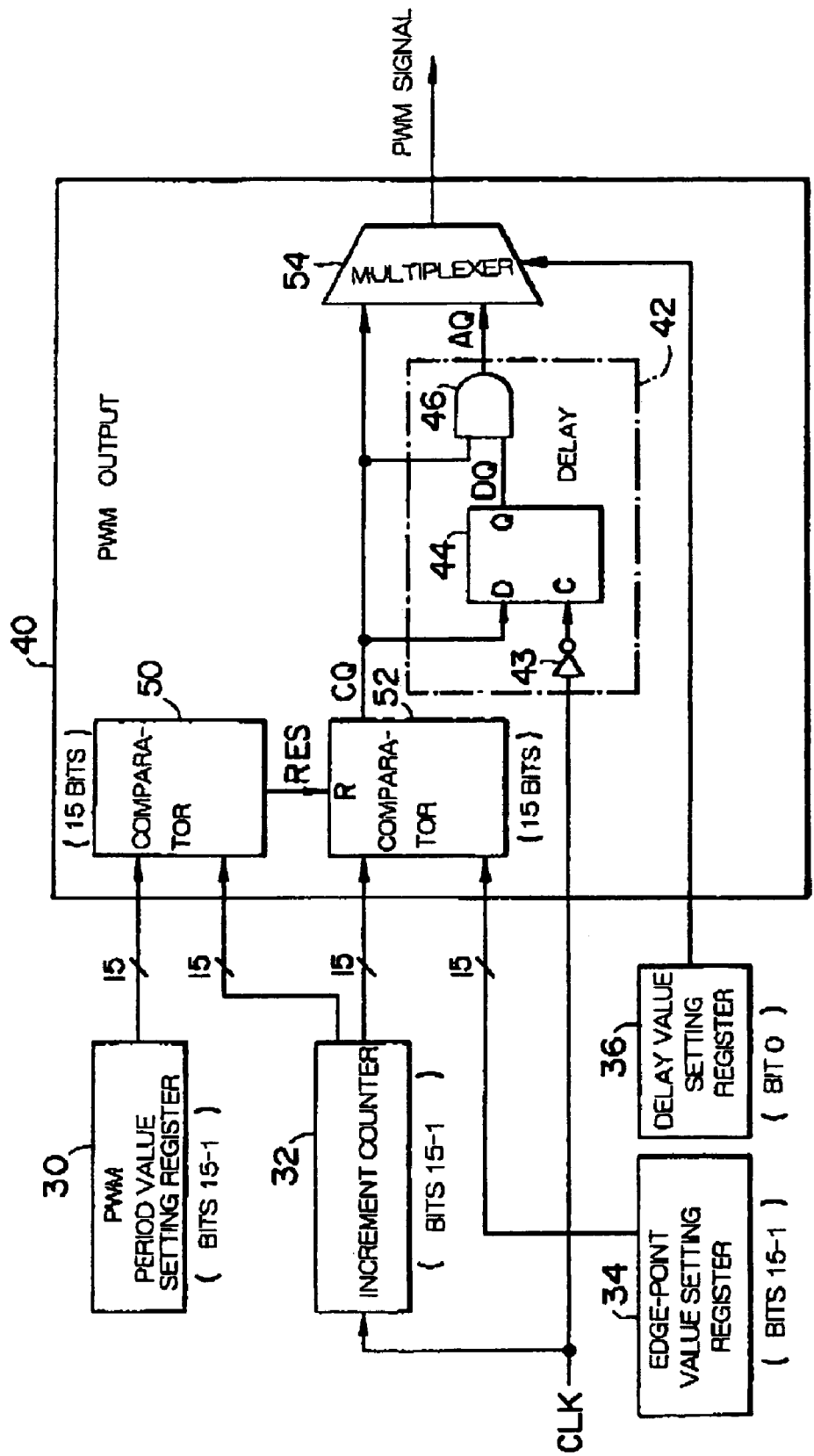
FIG. 3 is a block diagram of a PWM control circuit constructed according to the second embodiment of the present invention.

FIG. 3 shows a block diagram of a PWM control circuit constructed according to the second embodiment of the present invention. The PWM control circuit comprises a 15-bit PWM period value setting register 30, a 15-bit increment counter 32, a 15-bit edge-point value setting register 34, a one-bit delay value setting register 36 and a PWM output circuit 40. The PWM output circuit 40 comprises a delay circuit 42, a comparator 50, a comparator 52 and a multiplexer 54.

The second embodiment is mainly different from the first embodiment of FIG. 2A only in that the increment counter 32 is utilized, that the delay value setting register 36 is of one bit and that the details of the PWM output circuit 40 are shown. The functions, structures and operations of the blocks shown in FIG. 3 which are named in the same manner as in FIG. 2A are similar to those of FIG. 2A but will not further described herein.

Referring now to FIG. 3, the comparator 50 compares the count value from the increment counter 32 with the period value from the PWM period value setting register 30. If they are identical with each other, a signal RES is made H-level, as shown by E1 and E2 in FIG. 4.

The comparator 52 compares the count value from the increment counter 32 with the edge-point value from the edge-point value setting register 34. If they are identical with each other, a signal CQ (or first signal) is varied from L-level to H-level at the first edge-point 210, as shown by E3.

If the count value is identical with the period value and when the signal RES becomes H-level, the signal CQ is reset L-level, as shown by E4 and E5.

The delay circuit 42 includes an inverter 43, a D flip-flop 44 and AND circuit 46.

The inverter 43 inverts the operation clock CLK, the inverted CLK signal being inputted into one terminal C of the D flip-flop 44. Another terminal D of the D flip-flop 44 receives the signal CQ from the comparator 52. The D flip-flop 44 then samples this signal CQ with the inverted CLK signal (or samples at the falling edge of CLK). As shown by E6 in FIG. 4, therefore, the other terminal Q of the D flip-flop 44 will output a signal DQ delayed from the signal CQ by ½ clock period of CLK.

Figure 4:
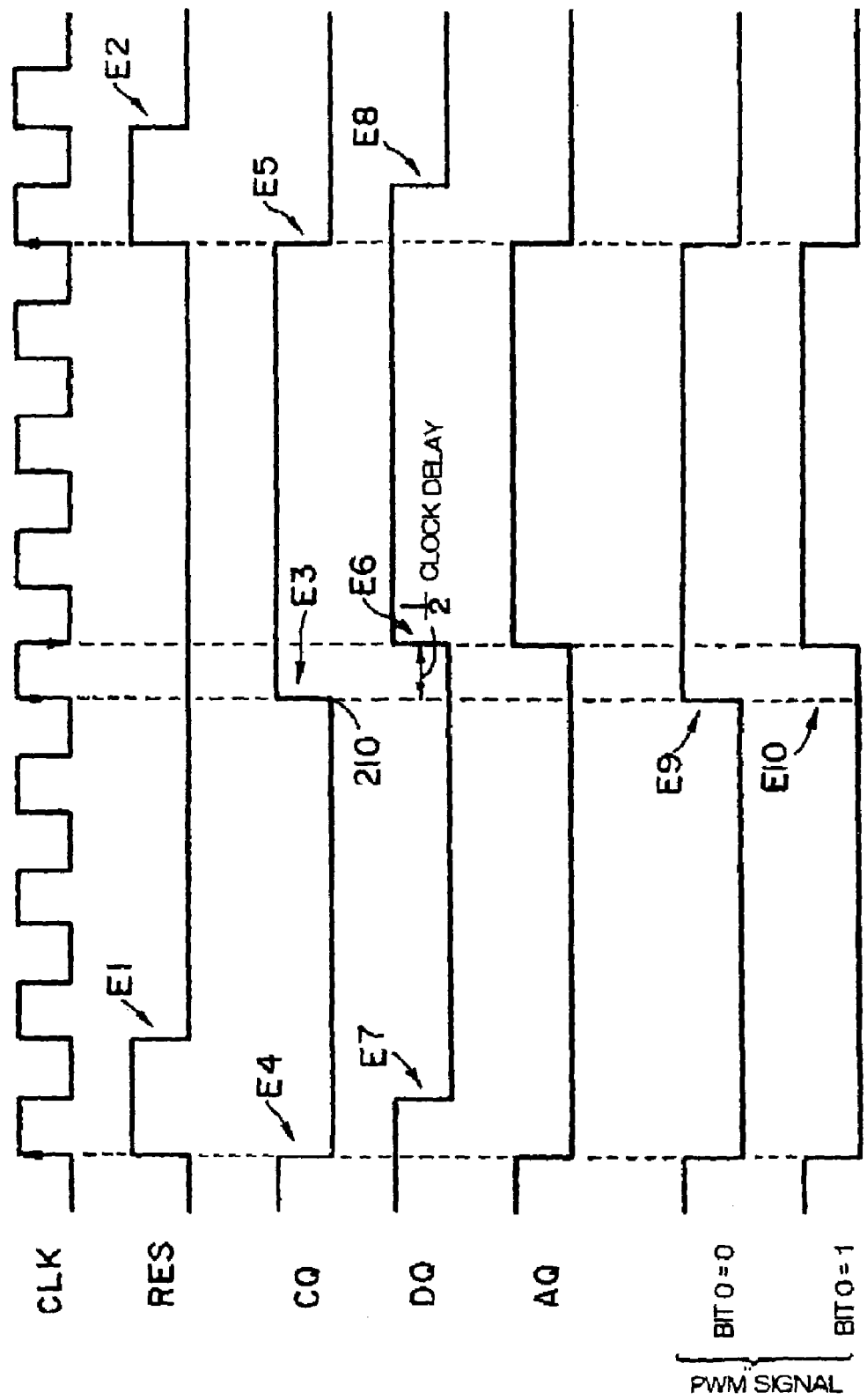
FIG. 4 is a diagram of signal waveform illustrating the operation of the PWM control circuit shown in FIG. 3.

The signals CQ and DQ are then inputted into the AND circuit 46 which in turn generates such a signal AQ (or second signal) as shown in FIG. 4. This signal AQ is in the form of a signal from which the portions of the signal DQ shown by E7 and E8 have been cut off.

The multiplexer 54 selects either of the signal CQ or AQ according to the delay value (or bit 0) from the delay value setting register 36. The selected signal is then outputted therefrom as a PWM signal. In other words, if the bit 0 (or the delay value) is zero, the signal CQ is selected and outputted as a PWM signal, as shown by E9. On the other hand, if the bit 0 is one, the signal AQ is selected and outputted as a PWM signal, as shown by E10.

According to the second embodiment, the first edge-point 210 of FIG. 4 is shifted in position by bits 15–1 (or edge-point values) that have been set by the edge-point value setting register 34. If the bit 0 set by the delay value setting register 36 is zero, the first edge-point 210 will not be delayed. If the bit 0 is one, the first edge-point 210 will be delayed by ½ clock period. In such a manner, the resolution of the PWM signal can be improved by one bit. More particularly, with the CLK frequency equal to 20 MHz, the resolution, which would be 8 bits in the prior art of FIG. 1B, can be increased by 9 bits. For 40 MHZ, the resolution, which would be 9 bits in the prior art, can be improved by 10 bits (where the frequency of the PWM signal being 80 KHz).

In addition, the second embodiment can be realized merely by adding some small-scaled circuits such as delay value setting register 36, delay circuit 42, multiplexer 54 and so on. As a result, the resolution of the PWM signal can be improved while minimizing the scale of circuit.

According to the second embodiment, with the bit 0 being one, the first edge-point 210 will be delayed by ½ clock period in a substantially accurate manner. Therefore, the quantizing error can be optimized.

As a technique different from the second embodiment, there may be considered a technique for operating all of the PWM period value setting register 30, increment counter 32, edge-point value setting register 34 and PWM output circuit 40 with the ½ clock period of CLK (or a technique for operating these circuits using both the rising and falling edges in CLK). Such a technique can also improve the resolution of the PWM signal by one bit.

However, such a technique must operate all of the PWM period value setting register 30, increment counter 32, edge-point value setting register 34. PWM output circuit 40 and so on at higher speeds. For 20–40 MHz, for example, the whole circuitry must be so designed as to operate all these circuits at 40–80 MHz. This raises other problems in that the manufacturing cost is increased and that it is difficult to design the circuitry.

On the contrary, only the delay circuit 32 (in particular, the D flip-flop 44) in the second embodiment is required to be operated at high speed. Thus, the design may be performed to operate only the delay circuit 42 at 40–80 MHz. In other words, it is sufficient that the PWM period value setting register 30, increment counter 32, edge-point value setting register 34, delay value setting register 36 and comparators 50, 52 may be actuated at 20–40 MHz. According to the second embodiment, therefore, the resolution of the PWM signal can be improved without taking of any expensive manufacturing process.

3. Third Embodiment

Figure 5:
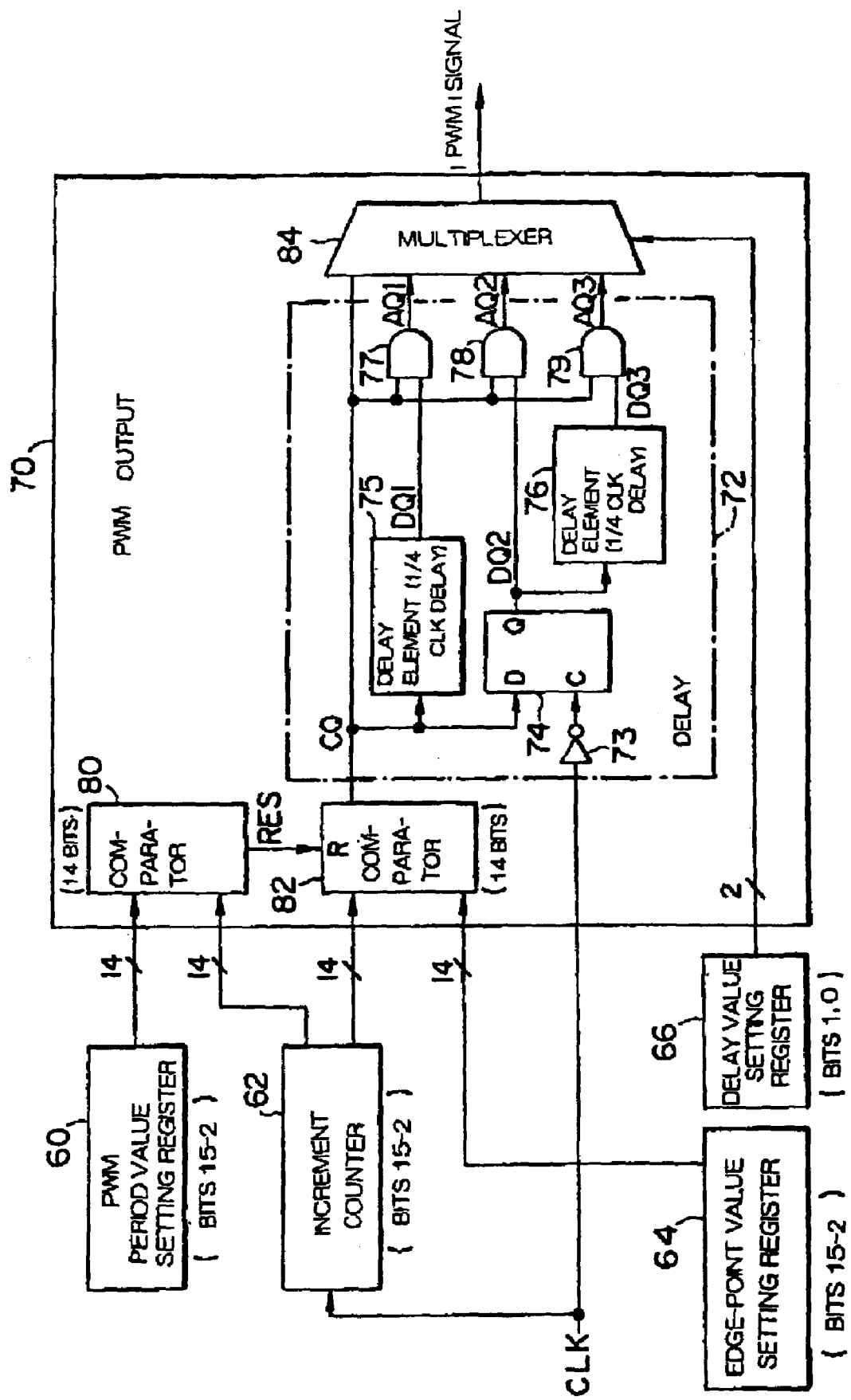
FIG. 5 is a block diagram of a PWM control circuit constructed according to the third embodiment of the present invention.

FIG. 5 shows a block diagram of a PWM control circuit constructed according to the third embodiment of the present invention. The third embodiment is different from the second embodiment of FIG. 3 only in that the number of bits in the delay value setting register 66 is two and that a delay circuit 72 is different in structure from that of the second embodiment. The functions, structures and operations of the blocks shown in FIG. 5 which are named in the same manner as in FIG. 3 are similar to those of FIG. 3 but will not further described herein.

Referring now to FIG. 5, the delay circuit 72 comprises an inverter 73, a D flip-flop 74, delay elements 75, 76 and AND circuits 77, 78 and 79.

Figure 6:
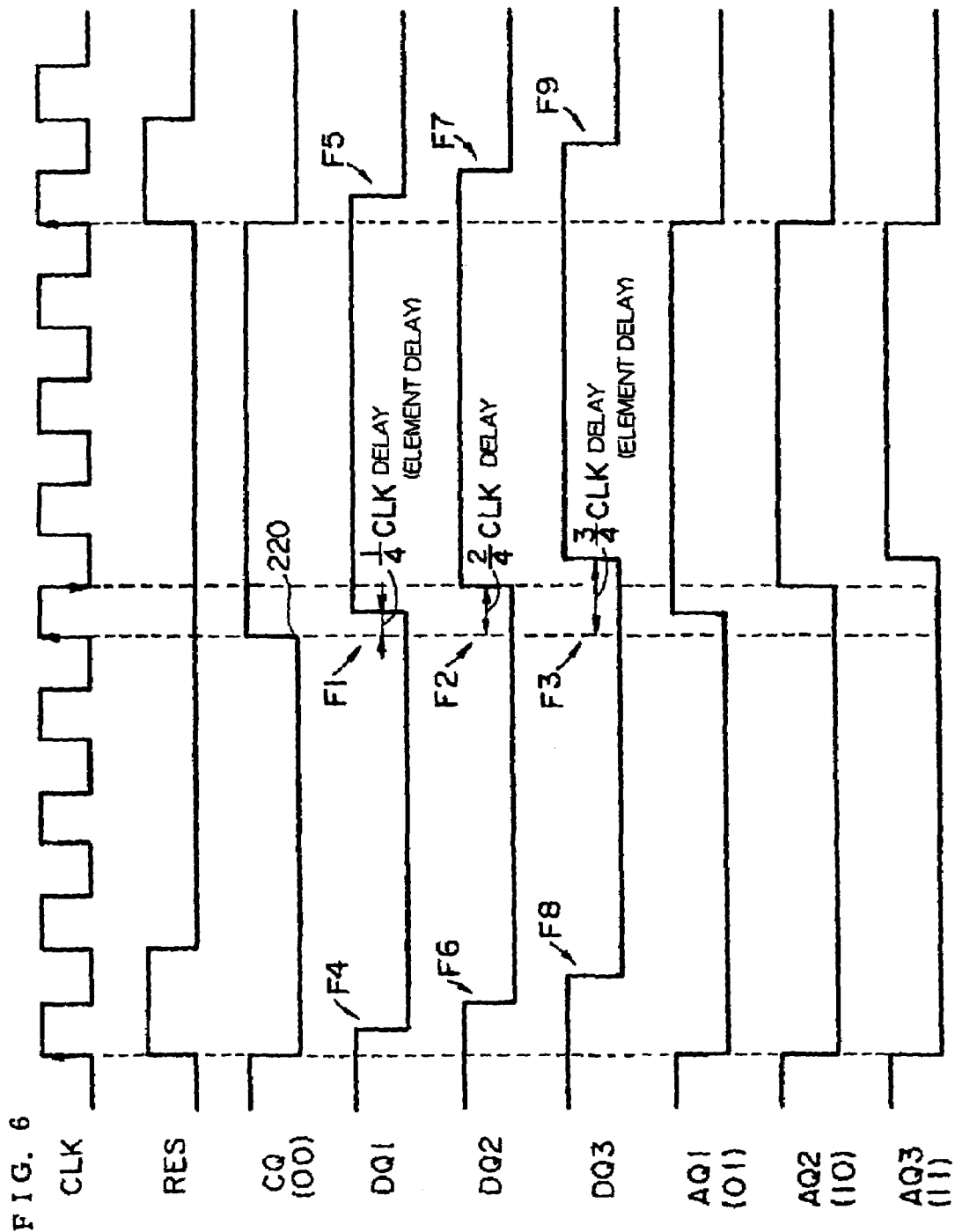
FIG. 6 is a diagram of signal waveform illustrating the operation of the PWM control circuit shown in FIG. 5.

The delay element 75 output a signal DQ1 generated by delaying a signal CQ from a comparator 82 by substantially ¼ clock period, as shown by F1 in FIG. 6. The D flip-flop 74 outputs a signal DQ2 generated by delaying the signal CQ by substantially ²⁄₄ clock period, as shown by F2. The delay element 76 outputs a signal DQ3 generated by delaying the signal CQ by substantially ¾ clock period (or a signal generated by delaying the signal DQ2 by substantially ¼ clock period), as shown by F3.

The functions of the delay elements 75 and 76 may be implemented, for example, by using a plurality of inverters connected in series with one another. Where the temperature or process may be changed, however, it is desired that the circuitry is designed to reduce variations of delay in the delay elements 75 and 76 as little as possible.

The AND circuit 77 receives the signal CQ (or first signal) and the signal DQ1 from the delay element 75 to generate a signal AQ1 (or second signal) shown in FIG. 6. The AND circuit 78 receives the signal CQ and the signal DQ2 from the D flip-flop 74 to generate a signal AQ2 (or third signal). The AND circuit 79 receives the signal CQ and the signal DQ3 from the delay element 76 to generate a signal AQ3 (or fourth signal). These signals AQ1, AQ2 and AQ3 are respectively in the form of signals obtained by cutting the portions of the respective signals DQ1, DQ2 and DQ3 shown by F4, F5, F6, F7, F8 and F9.

A multiplexer 84 selects and outputs either of the signals CQ, AQ1, AQ2 or AQ3 as a PWM signal, according to two delay values, bits 1 and 2, from a delay value setting register 66. If the bits 1, 0 are (00), the multiplexer 84 selects the signal CQ which is in turn outputted therefrom as a PWM signal. If the bits 1, 0 are (01), the multiplexer 84 selects the signal AQ1 which is in turn outputted therefrom as a PWM signal. If the bits 1, 0 are (10), the multiplexer 84 selects the signal AQ2 which is in turn outputted therefrom as a PWM signal. If the bits 1, 0 are (11), the multiplexer 84 selects the signal AQ3 which is in turn outputted therefrom as a PWM signal.

According to the third embodiment, the first edge-point 220 of FIG. 6 is shifted in position by bits 15–2 in an edge-point value setting register 64. If the bits 1, 0 in the delay value setting register 66 are (00), the first edge-point 220 will not be shifted. If the bits 1, 0 in the delay value setting register 66 are (01), the first edge-point 220 will be delayed by substantially ½ clock period. If the bits 1, 0 in the delay value setting register 66 are (10), the first edge-point 220 will be delayed by substantially ²⁄₄ clock period. If the bits 1, 0 in the delay value setting register 66 are (11), the first edge-point 220 will be delayed by substantially ¾ clock period. Thus, the resolution of the PWM signal can be increased by two bits. More particularly, with the CLK frequency of 20 MHz, the resolution, which would be 8 bits in the prior art of FIG. 1B, can be improved to be 10 bits. For 40 MHz, the resolution, which would be 9 bits, can be increased to 11 bits (with the frequency of the PWM signal equal to 80 KHz).

In addition, the third embodiment can be realized merely by adding some small-scaled circuits such as the delay value setting register 66, delay circuit 72, multiplexer 84 and so on. Therefore, the present invention can improve the resolution of the PWM signal while minimizing the scale of circuit.

Although the third embodiment has been described as to 2-bit delay value setting register 66 shown in FIG. 5, the present invention may similarly be applied to 3-bit or more delay value setting register 66. If the delay value setting register 66 is of M-bit, the first edge-point 220 of FIG. 6 may be delayed by substantially $\frac{1}{2}^M$ clock period of CLK, substantially $\frac{2}{2}^M$ clock period . . . or substantially $(2^M-1)/2^M$ clock period, in accordance with M-bit delay value. More particularly, the delay circuit 72 can be used to generate the second signal having its signal level which varies at a point delayed from the first edge-point by substantially $\frac{1}{2}^M$ clock period of CLK, the third signal having its signal level which varies at a point delayed from the first edge-point by substantially $\frac{2}{2}^M$ clock period of CLK, . . . and the $2^M$-th signal having its signal level which varies at a point delayed from the first edge-point by substantially $(2^M-1)/2^M$ clock period of CLK. Then, the multiplexer 84 may select a signal to be outputted as a PWM signal from among the signal CQ from the comparator 82 and the second through $2^M$-th signals, based on the M-bit delay value.

4. Fourth Embodiment

Figure 7:
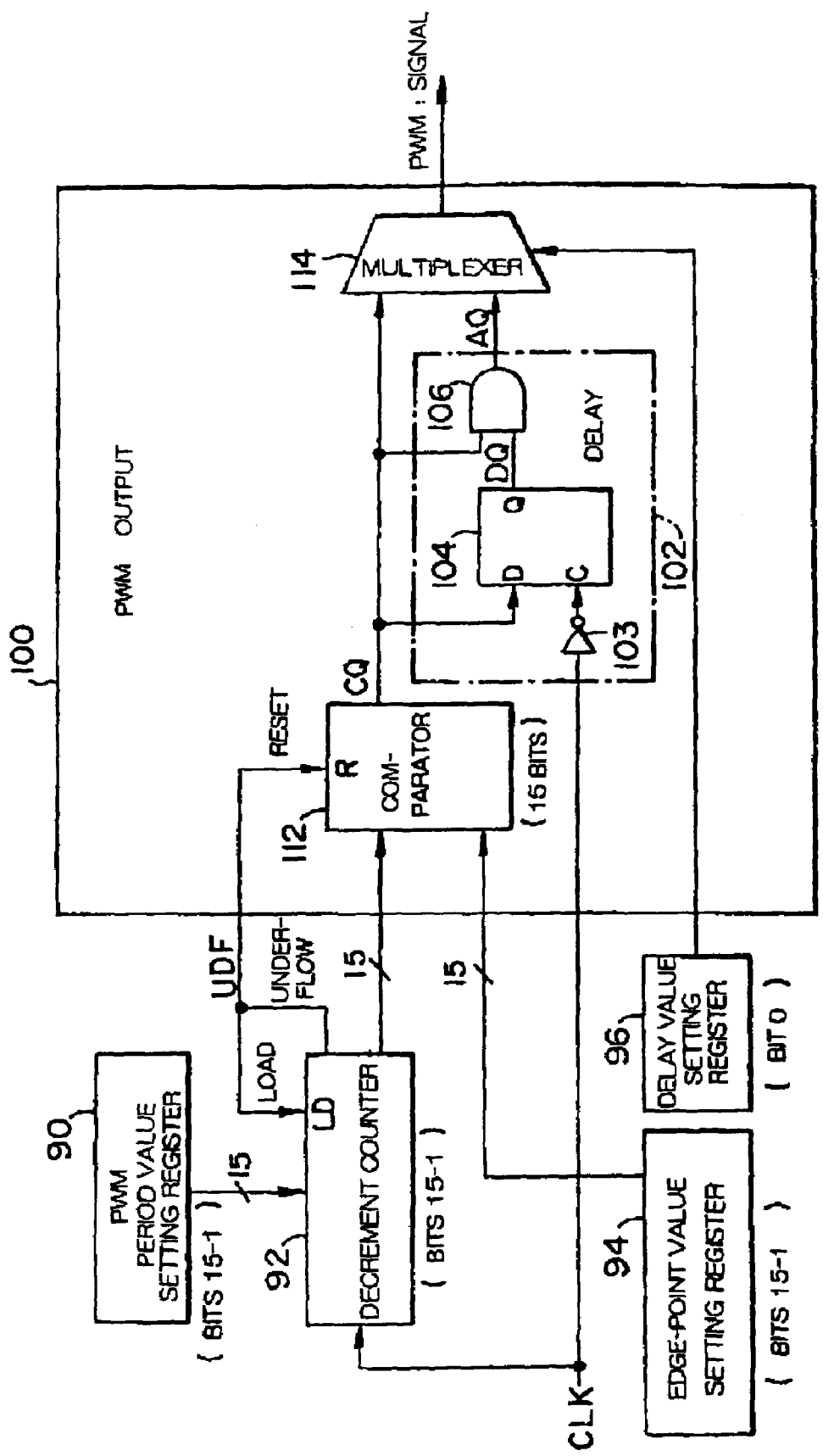
FIG. 7 is a block diagram of a PWM control circuit constructed according to the fourth embodiment of the present invention.

FIG. 7 shows a block diagram of a PWM control circuit constructed according to the fourth embodiment of the present invention. The fourth embodiment is mainly different from the second embodiment of FIG. 3 in that it uses a decrement counter 92 in place of the increment counter 32 shown in FIG. 3 and that the period value of a PWM period value setting register 90 can be loaded into the decrement counter 92 without provision of the comparator 50 shown in FIG. 3. The functions, structures and operations of the blocks shown in FIG. 7 which are named in the same manner as in FIG. 3 are similar to those of FIG. 3 but will not further described herein.

First of all, in FIG. 7, the period value of the PWM period value setting register 90 is loaded into the decrement counter 92. The decrement counter 92 then begins its decrementing operation. As the count value coincides with the edge-point value from an edge-point value setting register 94, the signal CQ is changed from L-level to H-level, as in E3 of FIG. 4.

As the decrementing operation in the decrement counter 92 proceeds to underflow, a signal UDF is made H-level. This makes the terminal R (or reset terminal) of a comparator 112 H-level. As a result, the signal CQ is reset from H-level to L-level, as in E5 of FIG. 4. Since the terminal LD (or load terminal) of the decrement counter 92 is also made H-level, the period value of the PWM period value setting register 90 is again loaded into the decrement counter 92. Thus, the decrement counter 92 begins to decrement its count value.

Figure 1C:
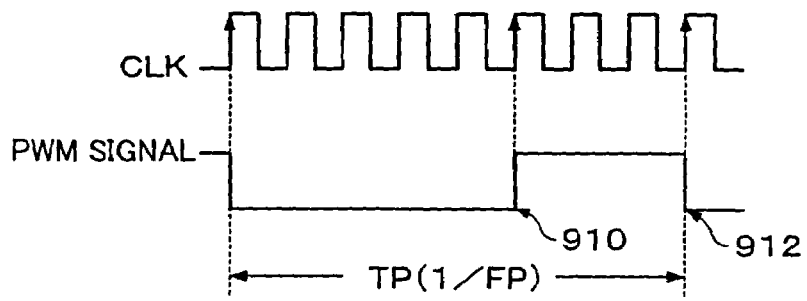

The structure of FIG. 7 can also increase the resolution by one bit, compared with the prior art of FIG. 1, by selecting either of the signals CQ or AQ through a multiplexer 114, in accordance with the one-bit delay value stored in the delay value setting register.

As in the structure of FIG. 7, the structure of FIG. 5 can also include a decrement counter in place of the increment counter 62 and load the period value of the PWM period value setting register into the decrement counter in place of providing the comparator 80.

In the aforementioned first to fourth embodiments, the desired settings in the period value setting registers, edge-point value setting registers and delay value setting registers may be made by the use of a microcomputer.

5. Microcomputer

Figure 8:
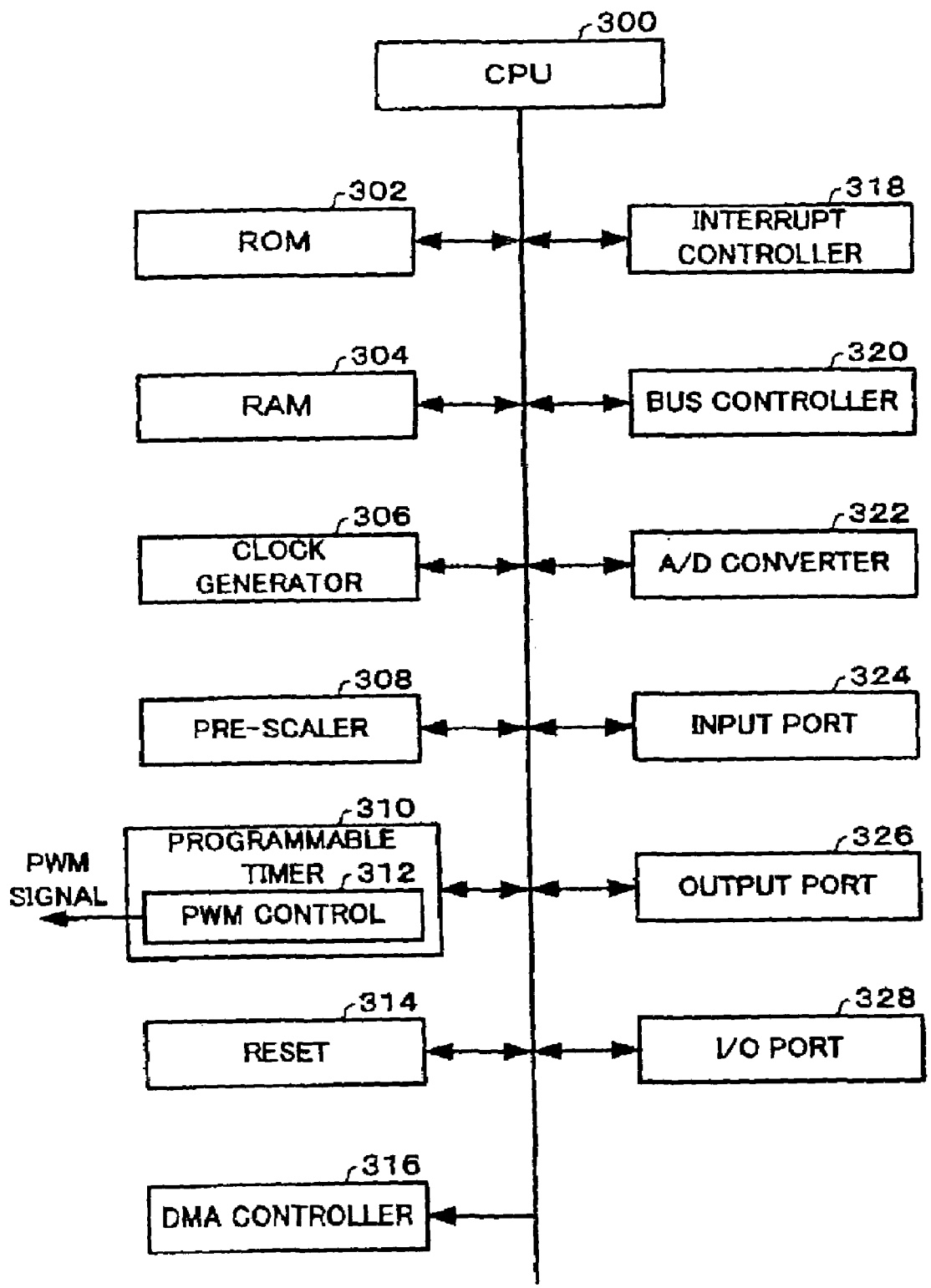
FIG. 8 is a block diagram showing an example of configuration of a microcomputer into which any of the PWM control circuits according to the first to fourth embodiments is incorporated.

FIG. 8 shows a block diagram of a microcomputer into which any of the PWM control circuits constructed according to the first to fourth embodiments is incorporated.

The microcomputer comprises a CPU for executing instructions (in a broad sense, processor), a ROM 302, a RAM 304, a clock generator 306, a pre-scaler 308, a programmable timer 310, a reset circuit 314, a DMA controller 316, an interrupt controller 318, a bus controller 320, an A/D converter 322, an input port 324, an output port 326, an I/O port 328 and so on.

A PWM control circuit 312 which is any one of the PWM control circuits previously described in connection with the first to fourth embodiment is incorporated into the 16-bit programmable timer 310. In other words, such a PWM control circuit 312 is realized by utilizing registers, counters, comparators and so on all of which are included in the programmable timer 310. The PWM control circuit 312 outputs a PWM signal toward any external. However, such an externally outputted signal may be in the form of an analog signal smoothened by a low-pass filter which is mounted in the microcomputer.

The period value, edge-point value and delay value for the PWM period value setting register, edge-point value setting register and delay value setting register included within the PWM control circuit 312 may be stored through the functions of the CPU 300 which is actuated according to a given software.

The operation clock used by the PWM control circuit 312 may be provided by either of the clock generator 306 or any external clock.

When the PWM control circuit 312 in the form of any of the structures according to the first to fourth embodiments is included within the microcomputer to generate analog signals such as sounds and the like by using the PWM signals from the PWM control circuit 312, any analog D/A converter is not required by the microcomputer. This causes the microcomputer to be more inexpensively manufactured and to design the microcomputer for a reduced time period. In addition, the PWM control circuit 312 can generate high-resolution PWM signals. As a result, the present invention can provide an inexpensive microcomputer which is optimally incorporated into electronic equipment which requires high-resolution analog signals.

6. Electronic Equipment

Electronic equipment including the aforementioned microcomputer will now be described.

Figure 9A:
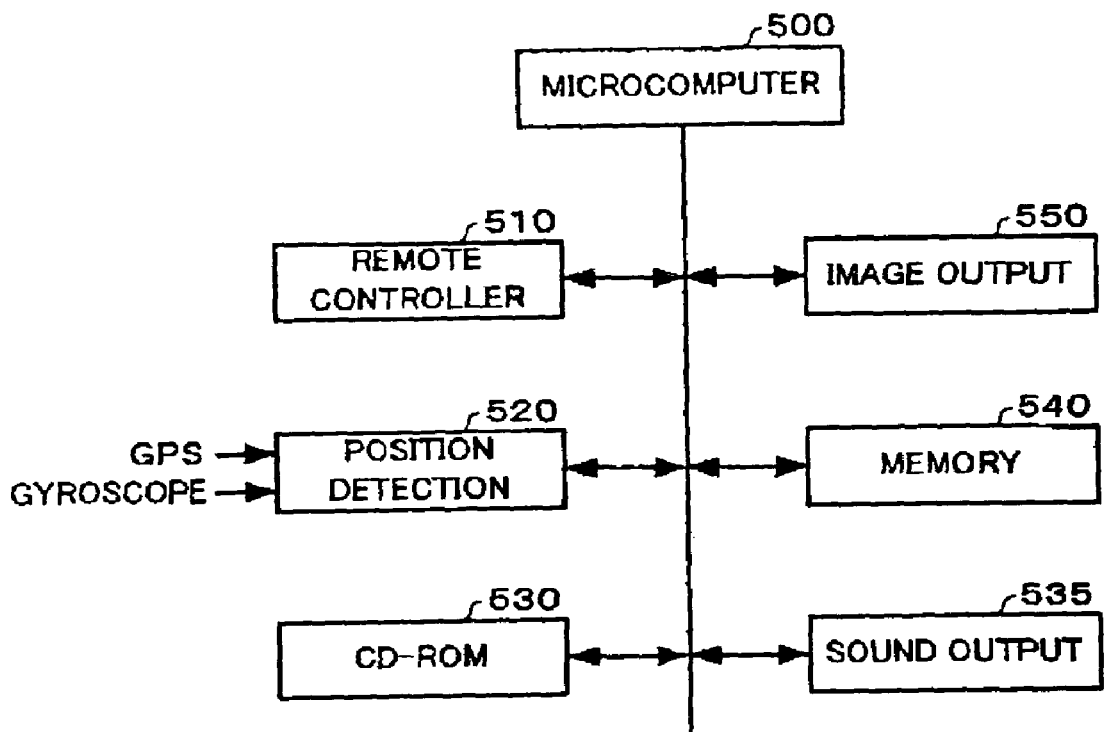
FIGS. 9A and B are internal block diagrams of various forms of electronic equipment.
Figure 10A:
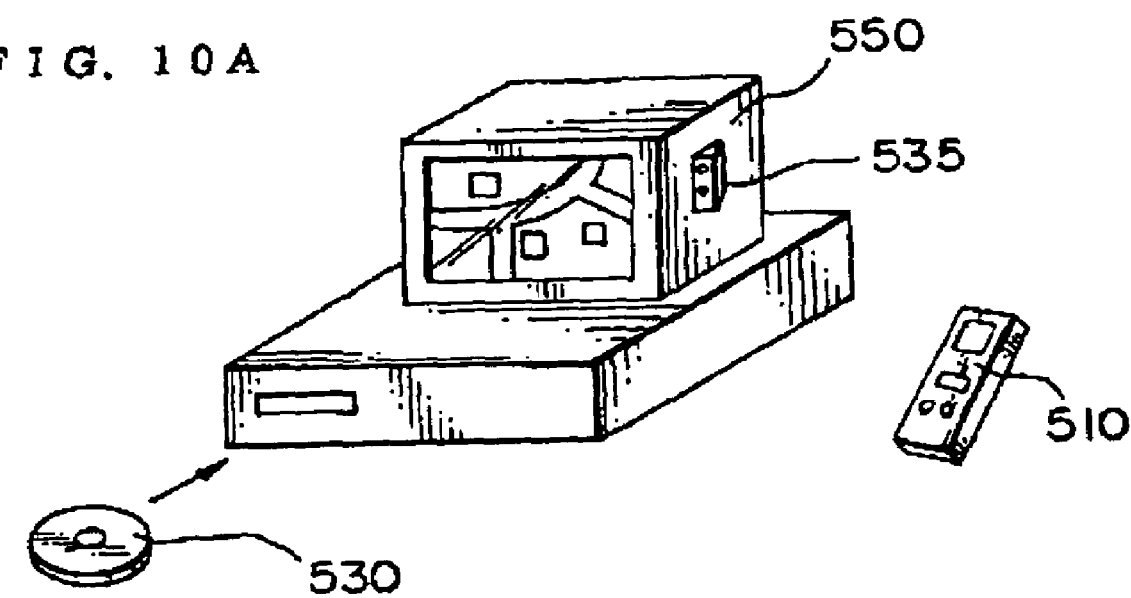
FIGS. 10A and B show the appearances of various forms of electronic equipment.

FIG. 9A is an internal block diagram of a car navigation system which is one of electronic equipment forms while FIG. 10A shows its appearance. The car navigation system is controlled through a remote controller 510 and includes a position detection section 520 which senses the present position of a motor-car according to information from GPS and gyroscope. Map information has been stored in CD-ROM 530 (or information storage medium). A memory 540 is used to provide a working area for image and sound processing. A generated image is displayed relative to a driver through an image output unit 550. A generated guide voice for car navigation is outputted toward the driver through a sound output unit 535. A microcomputer 500 receives various data from the sources of data input such as the remote controller 510, position detection section 520, CD-ROM 530 and so on and then outputs the processed data through the output devices such as the image output unit 550, sound output unit 535 and so on.

Figure 9B:
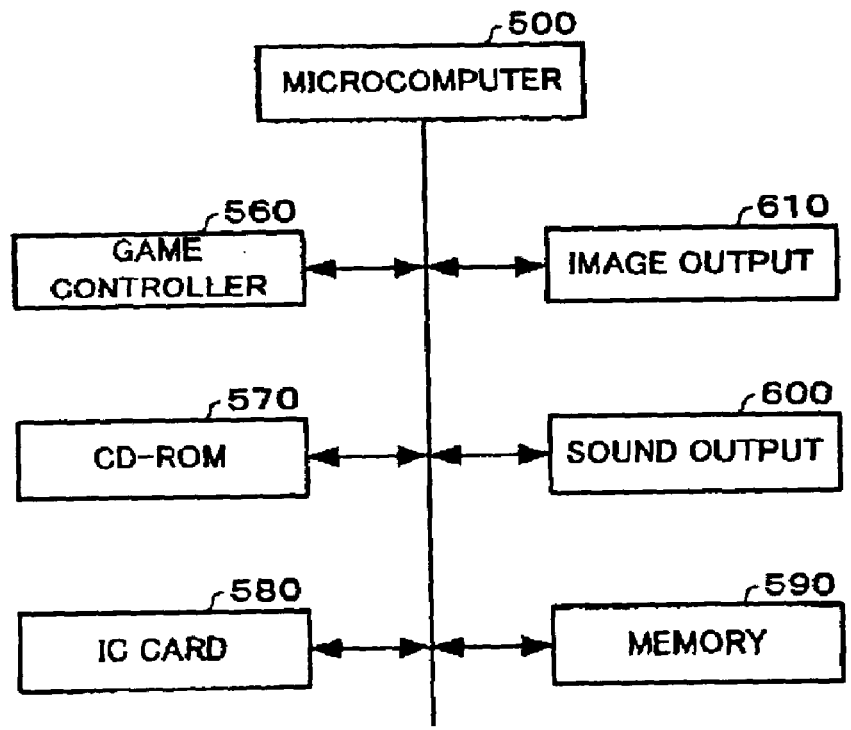
Figure 10B:
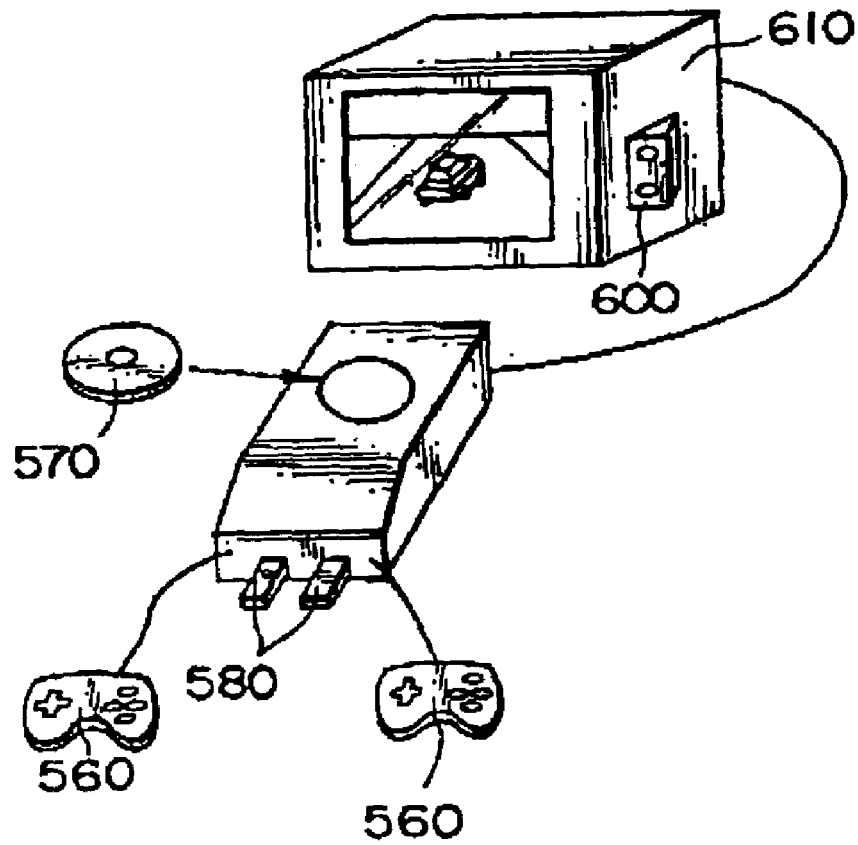

FIG. 9B is an internal block diagram of a game apparatus which is one of various electronic equipment forms while FIG. 10B shows its appearance. The game apparatus generates and outputs game images and sounds through image and sound output units 610, 600 in a memory 590 used as a working area, according to player's operational information from agate controller 560, a game program from a CD-ROM 570, player's information from an IC card 580 and so on.

If a microcomputer including any one of the PWM control circuits constructed according to the first to fourth embodiments is utilized in such electronic equipment, analog signals such as image and sound signals outputted from the electronic equipment can be improved in resolution. Thus, the salability of the electronic equipment can be improved. In addition, the electronic equipment can also be reduced in cost since the microcomputer incorporated into the electronic equipment can be reduced in scale and cost according to the present invention.

Note that the electronic equipment to which the microcomputer of the present invention can be applied is not limited to those described above, and thus it could be any of a portable telephone (cellular phone), a PHS, a pager, audio equipment, an electronic notebook, an electronic desk-top calculator, a POS terminal, a device provided with touch-panel, a projector, a word processor, a personal computer, a television set, a view-finder or direct monitor type of video tape recorder, or printer, by way of example.

The present invention is not limited to the aforementioned embodiments, but may be carried out in any of various forms which are changed and modified without departing from the sprit and scope of the invention.

For example, such structures of PWM control circuit according to the present invention as shown in FIGS. 2A, 3, 5 and 7 are particularly desirable, but not be limited to these forms.

The number of bits in the counters, edge-point value setting registers and delay value setting registers may optionally be selected.

Although it is particularly desirable to incorporate the PWM control circuit of the present invention into the microcomputer, it may be incorporated into ASIC or the like.

Although it is particularly desirable to use the PWM signal generated by the PWM control circuit of the present invention for generating sounds, it may similarly be utilized to controls of volume, tuning and motor.

The microcomputer and electronic equipment of the present invention are not limited to the forms described in connection with FIGS. 8 to 10B, but may be carried out in any of various changed and modified forms.

What is claimed is:

1. A PWM (pulse width modulation) control circuit for generating a PWM signal, comprising:
   a counter for incrementing or decrementing a count value in accordance with a given operation clock;
   an edge-point value setting register for storing an edge-point value which specifies a first edge-point at which the level of the PWM signal varies;
   a PWM output circuit for varying the level of the PWM signal at said first edge-point specified by said edge-point value, based on said count value from said counter and said edge-point value from said edge-point value setting register;
   a delay value setting register provided on low order side of said edge-point value setting register, for storing a delay value of at least one bit which specifies a delay time of said first edge-point; and
   a period value setting register for storing a period value which specifies a period of the PWM signal,
   wherein said PWM output circuit delays said first edge-point by a period which is smaller than one-clock period of said operation clock, in accordance with said delay value stored in said delay value setting register; and
   wherein said delay value setting register stores an M-bit delay value; and
   wherein said PWM output circuit delays said first edge-point by any one of substantially $1/2^M$ clock period, substantially $2/2^M$ clock period, and substantially $(2^M-1)/2^M$ clock period of said operation clock, in accordance with said M-bit delay value stored in said delay value setting register.

2. The PWM control circuit as defined in claim 1, wherein said PWM output circuit comprises:
   a comparator for comparing said count value from said counter with said edge-point value from said edge-point value setting register to generate a first signal having a signal level which varies at said first edge-point specified by said edge-point value;
   a delay circuit for generating a second signal having a signal level which varies at a point delayed from said first edge-point by substantially $1/2^M$ clock period of said operation clock, a third signal having a signal level which varies at a point delayed from said first edge-point by substantially $2/2^M$ clock period of said operation clock, . . . and a $2^M$-th signal having a signal level which varies at a point delayed from said first edge-point by substantially $(2^M-1)/2^M$ clock period of said operation clock, based on said first signal, said operation clock and a given delay element; and
   a multiplexer for selecting any of said first through $2^M$-th signals in accordance with said M-bit delay value stored in said delay value setting register.

3. A microcomputer for performing information processing, comprising:
   a programmable timer including the PWM control circuit as defined in claim 2; and
   a processor for executing instructions and for performing processing for storing said edge-point and delay values in said edge-point and delay value setting registers in said PWM control circuit.

4. Electronic equipment comprising:
   the microcomputer as defined in claim 3;
   a source of input data to be processed by said microcomputer; and
   an output device for outputting an analog signal by using the PWM signal generated by said PWM control circuit included in said microcomputer.

5. A microcomputer for performing information processing, comprising:
   a programmable timer including the PWM control circuit as defined in claim 1; and
   a processor for executing instructions and for performing processing for storing said edge-point and delay values in said edge-point and delay value setting registers in said PWM control circuit.

6. Electronic equipment comprising:
   the microcomputer as defined in claim 5;
   a source of input data to be processed by said microcomputer; and
   an output device for outputting an analog signal by using the PWM signal generated by said PWM control circuit included in said microcomputer.

* * * * *